(12) United States Patent
Seike et al.

(10) Patent No.: US 12,466,999 B2
(45) Date of Patent: Nov. 11, 2025

(54) SILICON ETCHING LIQUID, AND METHOD FOR PRODUCING SILICON DEVICE AND METHOD FOR PROCESSING SILICON SUBSTRATE, EACH USING SAID ETCHING LIQUID

(71) Applicant: TOKUYAMA CORPORATION, Yamaguchi (JP)

(72) Inventors: Yoshiki Seike, Yamaguchi (JP); Manami Oshio, Yamaguchi (JP); Seiji Tono, Yamaguchi (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 264 days.

(21) Appl. No.: 18/018,362

(22) PCT Filed: Jul. 29, 2021

(86) PCT No.: PCT/JP2021/028028
§ 371 (c)(1),
(2) Date: Jan. 27, 2023

(87) PCT Pub. No.: WO2022/025161
PCT Pub. Date: Feb. 3, 2022

(65) Prior Publication Data
US 2023/0295499 A1    Sep. 21, 2023

(30) Foreign Application Priority Data
Jul. 31, 2020 (JP) .................. 2020-130711

(51) Int. Cl.
C09K 13/00 (2006.01)
H01L 21/306 (2006.01)

(52) U.S. Cl.
CPC ........ C09K 13/00 (2013.01); H01L 21/30608 (2013.01)

(58) Field of Classification Search
CPC .............. C09K 13/00; H01L 21/30608; H01L 21/3085; H01L 21/30604
See application file for complete search history.

(56) References Cited

U.S. PATENT DOCUMENTS

| 2003/0017962 | A1 | 1/2003 | Naghshineh et al. |
| 2003/0207777 | A1 | 11/2003 | Naghshineh et al. |
| 2005/0020091 | A1 | 1/2005 | Fucsko et al. |
| 2005/0196587 | A1* | 9/2005 | Shinya ................ G11B 5/73911 428/141 |
| 2018/0197746 | A1 | 7/2018 | Bilodeau et al. |
| 2019/0085240 | A1* | 3/2019 | Liu .................... H01L 21/31111 |
| 2020/0048551 | A1* | 2/2020 | Tsai ......................... C09G 1/00 |
| 2021/0071034 | A1* | 3/2021 | Theivanayagam ... B24B 37/044 |
| 2022/0367199 | A1* | 11/2022 | Chang ................... C09K 13/06 |
| 2023/0287270 | A1* | 9/2023 | Seike ................ H01L 21/30604 |
| 2024/0124775 | A1* | 4/2024 | Seike .................... H01L 21/308 |

FOREIGN PATENT DOCUMENTS

| CN | 102093820 | A | 6/2011 |
| CN | 107936848 | A | 4/2018 |
| JP | 2000-160367 | A | 6/2000 |
| JP | 2005-507436 | A | 3/2005 |
| JP | 2006-59908 | A | 3/2006 |
| JP | 2009-32815 | A | 2/2009 |
| JP | 2010-141139 | A | 6/2010 |
| JP | 2012-227304 | A | 11/2012 |
| JP | 2013-135081 | A | 7/2013 |
| JP | 2018-519674 | A | 7/2018 |
| JP | 2019-50364 | A | 3/2019 |

OTHER PUBLICATIONS

International Search Report issued in International Bureau of WIPO Patent Application No. PCT/JP2021/028028, dated Oct. 12, 2021, along with an English translation thereof.
Office Action that issued in the corresponding Taiwanese Application No. 110128010, dated Dec. 23, 2024, along with English translation thereof.

* cited by examiner

Primary Examiner — Anita K Alanko
(74) Attorney, Agent, or Firm — GREENBLUM & BERNSTEIN, P.L.C.

(57) ABSTRACT

A silicon etching liquid which is characterized by containing a quaternary ammonium hydroxide represented by formula (1), a quaternary ammonium salt represented by formula (2) and water, and which is also characterized in that the concentration of the quaternary ammonium salt represented by formula (2) is more than 1% by mass but not more than 50% by mass. (1): $R^1R^2R^3R^4N^+ \cdot OH^-$ (In formula (1), $R^1$, $R^2$, $R^3$ and $R^4$ may be the same groups or different groups, and each represents an optionally substituted alkyl group, aryl group or a benzyl group.) (2): $R^5R^6R^7R^8N^+ \cdot X^-$ (In formula (2), $R^5$, $R^6$, $R^7$ and $R^8$ may be the same groups or different groups, and each represents an optionally substituted alkyl group having from 1 to 16 carbon atoms; and X represents $BF_4$, a fluorine atom, a chlorine atom or a bromine atom.)

6 Claims, No Drawings

SILICON ETCHING LIQUID, AND METHOD FOR PRODUCING SILICON DEVICE AND METHOD FOR PROCESSING SILICON SUBSTRATE, EACH USING SAID ETCHING LIQUID

TECHNICAL FIELD

The present invention relates to a silicon etching liquid used in surface treatment or in an etching step in producing various silicon devices. The present invention also relates to a method for producing a silicon device using the above-mentioned etching liquid. The present invention also relates to a method for processing a silicon substrate including a silicon material by using the above-mentioned etching liquid.

BACKGROUND ART

Silicon etching is used in various steps in semiconductor device production processes. In recent years, treatment processes using silicon have been widely used in a trend where memory cells are multilayered, logic devices are produced three-dimensionally and the like, and smoothness after etching, etching precision, etching selectivity with other materials, and the like have been strongly required on silicon etching used in the treatment processes because of densification of devices. In addition, silicon etching is also applied to processes such as wafer thinning. High integration, refinement, high sensitivity, and high functionality are required on the various silicon devices mentioned above depending on usages, and in order to meet these requirements, silicon etching is considered important as a fine processing technique in the production of these silicon devices. Silicon etching includes etching with a hydrofluoric acid-nitric acid aqueous solution and etching using alkali. The etching with the hydrofluoric acid-nitric acid aqueous solution can perform etching isotropically regardless of the crystal orientation of silicon, and can perform etching uniformly on silicon single crystal, poly-silicon, and amorphous silicon. However, since the hydrofluoric acid-nitric acid aqueous solution oxidizes silicon to produce a silicon oxide film and etches the silicon oxide film, no etching selectivity of silicon with respect to the silicon oxide film work. Accordingly, it is difficult to use the hydrofluoric acid-nitric acid aqueous solution in a semiconductor production process or the like in which the silicon oxide film is required to remain.

Subsequently, in the case of silicon etching with alkali, unlike the etching with the hydrofluoric acid-nitric acid aqueous solution, crystal anisotropy is exhibited. Crystal anisotropy refers to nature (etching anisotropy) that brings a difference in etching rate depending on the crystal orientation of silicon. By utilizing this nature, alkali etching is used for treatment of silicon devices having a complex three-dimensional structure with respect to silicon single crystal, and for smooth etching of silicon surfaces. Alkali has not only a high etching selectivity of silicon with respect to a silicon nitride film, but also a high etching selectivity of silicon with respect to a silicon oxide film, and therefore alkali can also be used in a semiconductor production process in which the silicon oxide film is required to remain. The term "high selectivity" refers to nature indicating a particularly high etching capability for silicon against a specific member. For example, when a substrate having a silicon film of silicon single crystal, poly-silicon or amorphous silicon, and another film (for example, a silicon oxide film) is etched in such a manner that only a silicon film is etched while the silicon oxide film is not etched, the etching selectivity of silicon with respect to the silicon oxide film is considered high. An alkaline etching liquid has selectivity with respect to a silicon oxide film and silicon nitride film, and selectively etches a silicon film.

As the above-mentioned etching liquid, it is possible to use an aqueous solution of a common alkaline chemical such as KOH, hydrazine, or tetramethylammonium hydroxide (hereinafter also referred to as TMAH) (see Patent Documents 1 and 2). Among the cited chemicals, KOH or TMAH having low toxicity and being easy to handle is preferably used alone. Of the two chemicals, TMAH is more preferably used in consideration of the mixing of metal impurities and the etching selectivity with a silicon oxide film.

With regard to etching using alkali, Patent Document 1 discloses an etching liquid for a silicon substrate for a solar cell, the etching liquid containing alkali hydroxide, water, and polyalkylene oxide alkyl ether. Patent Document 2 discloses an etching liquid for a silicon substrate for a solar cell, the etching liquid containing an alkaline compound, an organic solvent, surfactant, and water. In Patent Document 2, TMAH is exemplified as an example of an alkaline compound, and a polyalkylene oxide alkyl ether is exemplified as an organic solvent, but the alkaline compounds used in reality are sodium hydroxide and potassium hydroxide. Patent Document 3 discloses an alkaline etching liquid capable of selectively removing silicon with respect to silicon-germanium.

CITATION LIST

Patent Documents

Patent Document 1: JP 2010-141139 A
Patent Document 2: JP 2012-227304 A
Patent Document 3: JP 2019-050364 A

SUMMARY OF INVENTION

Technical Problem

The alkali-based etching liquid has the advantages as described above, but there are problem that the etching rate of a 111 plane of silicon is low and a pyramid-shaped hillock surrounded by the 111 plane, or the like occurs in some case, whereby etching smoothness during silicon etching is reduced or etching residues are generated. Although it is possible to solve the above problem by increasing the concentration of alkali, it is preferable to lower the concentration of alkali in the silicon etching liquid in view of costs, safety, and easiness of waste liquid treatment. However, when the alkali concentration is set on a low concentration side, a pyramid-shaped hillock surrounded by the 111 plane is likely to occur, and thus the etching smoothness is reduced and the surface roughness is likely to occur. To deal with this, such a silicon etching liquid is desired to be provided that is able to carry out processing in which the occurrence of a hillock on a silicon surface is suppressed, and has a high etching selection ratio with a silicon oxide film, by setting the alkali concentration on the low concentration side. Here, the etching selection ratio with the silicon oxide film represents a value calculated by dividing the etching rate of silicon by the etching rate of the silicon oxide film.

In the etching liquids of Patent Document 1 and Patent Document 2, NaOH or KOH is used as an alkaline compound. As described above, etching by alkali is high in selectivity with respect to a silicon oxide film compared to a hydrofluoric acid-nitric acid aqueous solution, but the etching rate of the silicon oxide film by alkaline metal hydroxide is high compared to quaternary ammonium hydroxide. Due to this, when a silicon oxide film is used in part of a mask material or a pattern structure in the etching of a silicon film, even the silicon oxide film required to remain during the silicon etching is also etched in a long-time process; in addition, an allowable etching amount of the oxide film is reduced accompanying the refinement. Accordingly, it is not possible to selectively etch only the silicon film without etching the silicon oxide film. Furthermore, these etching liquids are intended to increase crystal anisotropy and roughen the surface, and therefore the silicon film cannot be smoothly etched. The etching liquid described in Patent Document 3 is a chemical solution able to selectively remove silicon with respect to silicon-germanium, and it is not described in the document to smoothly etch the silicon.

An object of the present invention is to provide a silicon etching liquid that is able to carry out processing in which the occurrence of a hillock on a silicon surface is suppressed while maintaining the concentration of alkali at a low level of concentration, and has a high selection ratio with a silicon oxide film.

Solution to Problem

The inventors of the present inventions have found, as a result of concentrated research, that the above problems can be solved by using a silicon etching liquid containing a quaternary ammonium hydroxide represented by formula (1), a quaternary ammonium salt represented by formula (2), and water.

That is, a first aspect of the present invention relates to a silicon etching liquid including a quaternary ammonium hydroxide represented by formula (1), a quaternary ammonium salt represented by formula (2), and water; and the concentration of the quaternary ammonium salt represented by formula (2) is more than 1 mass % and not greater than 50 mass %.

$$R^1R^2R^3R^4N^+ \cdot OH^- \quad (1)$$

where $R^1$, $R^2$, $R^3$, and $R^4$ each represent an alkyl group, an aryl group, or a benzyl group optionally having a substituent, and are optionally the same group or different groups from each other;

$$R^5R^6R^7R^8N^+ \cdot X^- \quad (2)$$

where $R^5$, $R^6$, $R^7$, and $R^8$ each represent an alkyl group, having carbon number of 1 to 16 and optionally having a substituent, and are optionally the same group or different groups from each other, and are X represents $BF_4$, a fluorine atom, a chlorine atom, or a bromine atom.

It is preferable for the concentration of the quaternary ammonium hydroxide represented by formula (1) to be 0.05 mol/L or more and 1.1 mol/L or less in the first aspect of the present invention.

In the first aspect of the present invention, it is preferable for the total number of carbon atoms per molecule of the quaternary ammonium salt represented by formula (2) to be 4 or more and 12 or less.

A second aspect of the present invention is a method for processing a silicon substrate, the silicon substrate including at least one silicon material selected from the group consisting of a silicon wafer, a silicon single crystal film, a poly-silicon film, and an amorphous silicon film, the method including etching the at least one silicon material by using the silicon etching liquid of the first aspect of the present invention.

A third aspect of the present invention is a method for producing a silicon device, the silicon device including at least one silicon material selected from the group consisting of a silicon wafer, a silicon single crystal film, a poly-silicon film, and an amorphous silicon film, the method including etching the at least one silicon material by using the silicon etching liquid of the first aspect of the present invention.

Advantageous Effects of Invention

The silicon etching liquid of the present invention can smoothly etch a surface of a silicon substrate including at least one silicon material selected from the group consisting of a silicon wafer, a silicon single crystal film, a poly-silicon film, and an amorphous silicon film while maintaining the concentration of a quaternary ammonium hydroxide at a low level of concentration, and makes it possible to perform a silicon etching process in which a selection ratio with a silicon oxide film is high.

In particular, in an etching process of the silicon substrate, it is possible to suppress the occurrence of a pyramid-shaped hillock surrounded by the 111 plane, and suppress the roughness of the silicon surface (100 plane). In addition, since the concentration of the quaternary ammonium hydroxide can be processed on a low concentration side, it is also possible to reduce toxicity and the costs of waste liquid treatment. Accordingly, the silicon etching liquid of the present invention is particularly useful as a silicon etching liquid for smoothly etching the silicon surface (100 plane).

DESCRIPTION OF EMBODIMENTS

Embodiments of the present invention will be described in detail below. However, the descriptions given below are examples (representative examples) of the embodiments of the present invention, and the present invention is not limited to the contents below within the scope and spirit of the invention.

In the present specification, a numerical range represented by using the sign "–" refers to a range including the numerical value described before "–" as the lower limit value and the numerical value described after "–" as the upper limit value, and thus the expression "A–B" means "not smaller than A and not greater than B".

The present invention includes aspects as follows, and the like.

Aspect 1: a silicon etching liquid comprising a quaternary ammonium hydroxide represented by formula (1), a quaternary ammonium salt represented by formula (2), and water, wherein a concentration of the quaternary ammonium salt represented by formula (2) is more than 1 mass % and not more than 50 mass %:

$$R^1R^2R^3R^4N^+ \cdot OH^- \quad (1)$$

where $R^1$, $R^2$, $R^3$, and $R^4$ each represent an alkyl group, an aryl group, or a benzyl group optionally having a substituent, and are optionally the same group or different groups from each other;

$$R^5R^6R^7R^8N^+ \cdot X^- \quad (2)$$

where $R^5$, $R^6$, $R^7$, and $R^8$ each represent an alkyl group, having carbon number of 1 to 16 and optionally having a substituent, and are optionally the same group or different groups from each other, and are X represents BF$_4$, a fluorine atom, a chlorine atom, or a bromine atom.

Aspect 2: the silicon etching liquid according to aspect 1, wherein a concentration of the quaternary ammonium hydroxide represented by formula (1) is 0.05 mol/L or more and 1.1 mol/L or less.

Aspect 3: the silicon etching liquid according to aspect 1 or 2, wherein the total number of carbon atoms per molecule of the quaternary ammonium salt represented by formula (2) is 4 or more and 12 or less.

Aspect 4: a method for processing a silicon substrate, the silicon substrate containing at least one silicon material selected from the group consisting of a silicon wafer, a silicon single crystal film, a poly-silicon film, and an amorphous silicon film, the method comprising:
  etching the at least one silicon material by using the silicon etching liquid according to any one of aspects 1 to 3.

Aspect 5: a method for producing a silicon device, the silicon device containing at least one silicon material selected from the group consisting of a silicon wafer, a silicon single crystal film, a poly-silicon film, and an amorphous silicon film, the method comprising:
  etching the at least one silicon material by using the silicon etching liquid according to any one of aspects 1 to 3.

An isotropic silicon etching liquid of the present invention is a silicon etching liquid containing a quaternary ammonium hydroxide represented by formula (1), a quaternary ammonium salt represented by formula (2), and water; and the concentration of the quaternary ammonium salt represented by formula (2) is more than 1 mass % and not more than 50 mass %:

$$R^1R^2R^3R^4N^+ \cdot OH^- \quad (1)$$

where $R^1$, $R^2$, $R^3$, and $R^4$ each represent an alkyl group, an aryl group, or a benzyl group optionally having a substituent, and are optionally the same group or different groups from each other;

$$R^5R^6R^7R^8N^+ \cdot X^- \quad (2)$$

where $R^5$, $R^6$, $R^7$, and $R^8$ each represent an alkyl group, having carbon number of 1 to 16 and optionally having a substituent, and are optionally the same group or different groups from each other, and X represents BF$_4$, a fluorine atom, a chlorine atom, or a bromine atom.

In the quaternary ammonium hydroxide represented by formula (1), $R^1$, $R^2$, $R^3$, and $R^4$ each represent an alkyl group, an aryl group, or a benzyl group optionally having a substituent, and are optionally the same group or different groups from each other.

The alkyl group is preferably an alkyl group having carbon number of 1 to 4, and the aryl group is preferably an aryl group having carbon number of 6 to 10.

Substituents that an alkyl group, aryl group, and benzyl group can include are not particularly limited, and examples of the substituents include a halogenyl group, a hydroxy group, an alkoxy group having carbon number of 1 to 20, —C≡N, —NH$_3$, —C(═O)OH, —C(═O)OR', —C(═O)R', —SH, —SiR$^a$R$^b$R$^c$, —BH$_2$, —SeH, a monovalent aromatic hydrocarbon cyclic group, and a monovalent aromatic heterocyclic group. R', R$^a$, R$^b$, and R can each represent hydrogen or an alkyl group having carbon number of 1 to 20, are optionally the same group or different groups from each other, and are each preferably a hydroxy group because of being excellent in solubility into water particularly as a substituent.

Examples of $R^1$, $R^2$, $R^3$, and $R^4$ can include an unsubstituted alkyl group having carbon number of 1 to 4, such as a methyl group, ethyl group, n-propyl group, i-propyl group, n-butyl group, i-butyl group, sec-butyl group, or tert-butyl group; an alkyl group having carbon number of 1 to 4 and substituted with a hydroxy group, such as a hydroxymethyl group, hydroxyethyl group, hydroxy-n-propyl group, hydroxy-i-propyl group, hydroxy-n-butyl group, hydroxy-i-butyl group, hydroxy-sec-butyl group, or hydroxy-tert-butyl group; a phenyl group; a tolyl group; an o-xylyl group; and a benzyl group.

It is preferable that the total number of carbon atoms in $R^1$, $R^2$, $R^3$, and $R^4$ be less than or equal to 20 from the perspective of solubility. It is preferable that each of $R^1$, $R^2$, $R^3$, and $R^4$ be an alkyl group having carbon number of 1 to 4, or an alkyl group having carbon number of 1 to 4 and substituted with a hydroxy group, and it is particularly preferable that at least three of $R^1$, $R^2$, $R^3$, and $R^4$ be the same alkyl group.

Examples of the quaternary ammonium hydroxide represented by formula (1) can include tetramethylammonium hydroxide (TMAH), tetraethylammonium hydroxide (TEAH), ethyltrimethylammonium hydroxide (ETMAH), tetrapropylammonium hydroxide (TPAH), tetrabutylammonium hydroxide (TBAH), trimethyl-2-hydroxyethylammonium hydroxide (choline hydroxide), dimethylbis (2-hydroxyethyl) ammonium hydroxide, methyltris (2-hydroxyethyl) ammonium hydroxide, trimethylphenylammonium hydroxide, and benzyltrimethylammonium hydroxide. Among these, TMAH, choline hydroxide, TEAH, ETMAH, TPAH, or TBAH can be used preferably. In particular, it is most preferable to use TMAH, choline hydroxide, ETMAH, TEAH, or TPAH because of a high etching rate of silicon.

As the concentration of the quaternary ammonium hydroxide represented by formula (1) in the silicon etching liquid, the concentration of a silicon etching liquid of related art can be applied similarly, and when the concentration is 0.05 mol/L or more and 1.1 mol/L or less, an excellent etching effect is preferably obtained without the occurrence of crystal precipitation. It is more preferable for the concentration of the quaternary ammonium hydroxide to be 0.05 mol/L or more and 0.6 mol/L or less.

One type of quaternary ammonium represented by formula (1) can be used alone, or a plurality of different types thereof can be mixed and used.

The silicon etching liquid of the present invention contains the quaternary ammonium salt represented by formula (2). Containing the quaternary ammonium salt represented by formula (2) enables smooth etching without roughening the silicon surface.

In the quaternary ammonium salt represented by formula (2), $R^5$, $R^6$, $R^7$, and $R^8$ each represent an alkyl group, having carbon number of 1 to 16 and optionally having a substituent, and are optionally the same group or different groups from each other. Substituents that an alkyl group can include are not particularly limited, and examples of the substituents include a halogenyl group, a hydroxy group, an alkoxy group having carbon number of 1 to 20, —C≡N, —NH$_3$, —C(═O)OH, —C(═O)OR', —C(═O)R', —SH, —SiR$^a$R$^b$R$^c$, —BH$_2$, —SeH, a monovalent aromatic hydrocarbon cyclic group, and a monovalent aromatic heterocyclic group. R', R$^a$, R$^b$, and R$^c$ can each represent hydrogen or an alkyl group having carbon number of 1 to 20, are optionally the same group or different groups from each other, and are each preferably a hydroxy group because of being excellent in solubility into water particularly as a substituent.

Examples of $R^5$, $R^6$, $R^7$, and $R^8$ can include an unsubstituted alkyl group having carbon number of 1 to 16, such as a methyl group, ethyl group, n-propyl group, i-propyl group, n-butyl group, i-butyl group, sec-butyl group, tert-butyl group, hexyl group, octyl group, decyl group, dodecyl group, tetradecyl group, or hexadecyl group; and an alkyl group having carbon number of 1 to 4 and substituted with a hydroxy group, such as a hydroxymethyl group, hydroxyethyl group, hydroxy-n-propyl group, hydroxy-i-propyl group, hydroxy-n-butyl group, hydroxy-i-butyl group, hydroxy-sec-butyl group, or hydroxy-tert-butyl group.

The total number of carbon atoms per molecule of the quaternary ammonium salt represented by formula (2) is preferably 4 or more, more preferably 8 or more, further preferably 11 or more, preferably 20 or less, more preferably 15 or less, further preferably 14 or less, and particularly preferably 12 or less, from the perspective of solubility into water and capability of performing smooth etching on the silicon surface.

All of $R^5$, $R^6$, $R^7$, and $R^8$ can be of the same group, but it is preferable that at least one of them be a different group. More preferably, at least one of the groups of $R^5$, $R^6$, $R^7$ and $R^8$ is an alkyl group having carbon number of 2 or more and 16 or less, and the remainder groups are alkyl groups having carbon number of 1 or more and 4 or less; further preferably, the remainder groups are alkyl groups carbon number of 1 or more and 2 or less, and particularly preferably, the remainder groups are methyl groups having carbon number of 1.

X represents $BF_4$, a fluorine atom, a chlorine atom or a bromine atom, and preferably represents a chlorine atom or a bromine atom.

Specific examples of the quaternary ammonium salt represented by formula (2) preferably used in the present invention include a tetramethylammonium salt, tetraethylammonium salt, tetrapropylammonium salt, tetrabutylammonium salt, ethyltrimethylammonium salt, butyltrimethylammonium salt, hexyltrimethylammonium salt, octyltrimethylammonium salt, decyltrimethyl ammonium salt, dodecyltrimethylammonium salt, tetradecyltrimethylammonium salt, and hexadecyltrimethylammonium salt. Of these, an octyltrimethylammonium salt, decyltrimethylammonium salt, dodecyltrimethylammonium salt, tetradecyltrimethylammonium salt and hexadecyltrimethylammonium salt are further preferred, and an octyltrimethylammonium salt, decyltrimethylammonium salt or dodecyltrimethylammonium salt can be particularly preferably used.

One type of quaternary ammonium salt represented by formula (2) can be used alone, or a plurality of different types thereof can be mixed and used.

Quaternary ammonium cations of the quaternary ammonium hydroxide represented by formula (1) and the quaternary ammonium salt represented by formula (2) can be identical.

When the cation of the quaternary ammonium hydroxide represented by formula (1) and the cation of the quaternary ammonium salt represented by formula (2) are identical, the concentration of the quaternary ammonium cations of the quaternary ammonium salt represented by formula (2) can be calculated from the concentration of anions of the quaternary ammonium salt represented by formula (2). Specifically, the concentration of the anions and the concentration of the cations are equivalent to each other in a molar ratio, and further, from the concentration of the above cations, the concentration of the quaternary ammonium cations of the quaternary ammonium salt represented by formula (2) can be calculated; to be specific, the concentration of the cations is a concentration calculated by subtracting the concentration of the cations of the quaternary ammonium hydroxide represented by formula (1) from the quaternary ammonium cation concentration of the whole etching liquid.

In the present embodiment, it is possible to treat the silicon etching liquid considering that the quaternary ammonium hydroxide represented by formula (1) and the quaternary ammonium salt represented formula (2) are contained therein when the cations and anions constituting the quaternary ammonium hydroxide represented by formula (1) and the cations and anions constituting the quaternary ammonium salt represented by formula (2) are contained.

The concentration of the quaternary ammonium salt represented by formula (2) in the silicon etching liquid is preferably 1 mass % or more and 50 mass % or less, more preferably 1 mass % or more and 35 mass % or less, further preferably 1 mass % or more and 20 mass %, or less particularly preferably 1 mass % or more and 15 mass % or less, and most preferably 1.5 mass % or more and 15 mass % or less, because it is possible to perform smooth etching without causing roughness on the silicon surface, specifically, because the surface roughness of the 100 plane is reduced and the occurrence of a pyramid-shaped hillock surrounded by the 111 plane is suppressed, thereby making it possible to perform smooth etching even when the concentration of the quaternary ammonium hydroxide represented by formula (1) is low.

Furthermore, in the silicon etching liquid, the ratio of the concentration of the quaternary ammonium salt represented by formula (2) to the concentration of the quaternary ammonium hydroxide represented by formula (1) (formula (2)/formula (1)) is not particularly limited. However, because an insufficient addition of the quaternary ammonium salt represented by formula (2) makes it difficult to perform smooth etching, and an excessive addition of the quaternary ammonium salt represented by formula (2) causes a reduction in the etching rate, the ratio thereof, in terms of a molar ratio, is typically 0.02 or more and 10.00 or less, preferably 0.03 or more and 5.00 or less, and more preferably 0.04 or more and 2.50 or less.

The form of water in the silicon etching liquid is not particularly limited, and any known water can be used, and ultrapure water with reduced metal impurities is particularly preferred. The content of water in the silicon etching liquid is not particularly limited, and is typically 30 mass % or more, preferably 60 mass % or more, and more preferably 80 mass % or more; further, the content thereof is 99 mass % or less, preferably 98 mass % or less, and more preferably 97 mass % or less.

Without departing from the object of the present invention, a surfactant or the like can be added to the silicon etching liquid besides the quaternary ammonium hydroxide represented by formula (1) and the quaternary ammonium salt represented by formula (2). However, since the surfactant or the like can affect the etching property, the content thereof is preferably 1 mass % or less, and more preferably is zero (is below the detection limit). Accordingly, it is preferable that the silicon etching liquid be substantially composed of the quaternary ammonium hydroxide represented by formula (1), the quaternary ammonium salt represented by formula (2), and water; the content of other components excluding the above-mentioned components is preferably not more than 1 mass %, and more preferably is zero. That is, it is preferable that all of the remainder of the silicon etching liquid excluding the quaternary ammonium hydroxide represented by formula (1) and the quaternary ammonium salt represented by formula (2) be water.

A mechanism is not necessarily apparent in which the occurrence of a pyramid-shaped hillock surrounded by the 111 plane on the silicon surface after silicon etching is suppressed by adding the quaternary ammonium salt represented by formula (2) even when the concentration of the quaternary ammonium hydroxide represented by formula (1) is on the low concentration side, which makes the silicon surface likely to be roughened. However, the inventors of the present invention consider the mechanism as follows. In the case of silicon etching with alkali, water in the etching liquid contributes to the reaction, and the concentration of the water largely affects the behavior of the silicon etching. It has been clarified that it is possible to suppress the occurrence of a pyramid-shaped hillock surrounded by the 111 plane typically by increasing the alkali concentration and reducing the concentration of water. The inventors of the present invention consider that the addition of the quaternary ammonium salt represented by formula (2) progresses the hydration of ions and reduces free water molecules, and thus the concentration of water that contributes to the silicon etching is reduced even when the concentration of the quaternary ammonium hydroxide represented by formula (1) is on the low concentration side, thereby making it possible to suppress the occurrence of a pyramid-shaped hillock surrounded by the 111 plane.

At this time, in order to enhance the smoothness of the silicon surface, it is preferable to cause an etching rate ratio of the 100 plane and 111 plane of the silicon (100/111) to approach 1, more preferable to cause the ratio to be not more than 3.2, and further preferable to cause the ratio to be not more than 2.8, thereby making it possible to improve the smoothness. The inventors of the present invention consider that the etching rate ratio (100/111) is lowered to approach 1 by the addition of the quaternary ammonium salt represented by formula (2), which also contributes to the suppression of the occurrence of a pyramid-shaped hillock surrounded by the 111 plane.

In the silicon etching liquid, the quaternary ammonium hydroxide represented by formula (1) and the quaternary ammonium salt represented by formula (2) are ionized and dissociated into quaternary ammonium hydroxide cations represented by formula (1'), quaternary ammonium cations represented by formula (2'), and X$^-$:

$$R^1R^2R^3R^4N^+ \quad (1')$$

where $R^1$, $R^2$, $R^3$, and $R^4$ are the same as those in formula (1);

$$R^5R^6R^7R^8N^+ \quad (2')$$

where $R^5$, $R^6$, $R^7$, and $R^8$ are the same as those in formula (2).

Accordingly, a silicon etching liquid containing these ionic species is the silicon etching liquid of the present invention.

At this time, it goes without saying that the quaternary ammonium hydroxide cations represented by formula (1') has the same concentration as that of the quaternary ammonium hydroxide represented by formula (1), and the quaternary ammonium cations represented by formula (2') and X$^-$ have the same concentration as that of the quaternary ammonium salt represented by formula (2).

The composition of the silicon etching liquid of the present invention can be confirmed by analyzing and quantifying the ionic components in the liquid and the concentration thereof, and converting the resultants to the quaternary ammonium hydroxide represented by formula (1) and the quaternary ammonium salt represented by formula (2). Quaternary ammonium cations can be measured by liquid chromatography or ion chromatography, OH$^-$ ions can be measured by neutralization titration, and X ions can be measured by ion chromatography.

(Method for Producing Silicon Etching Liquid)

A method for producing the silicon etching liquid of the present invention is not particularly limited. It is sufficient that the quaternary ammonium hydroxide represented by formula (1) and the quaternary ammonium salt represented by formula (2) are mixed with water so as to have a predetermined concentration, and these quaternary ammonium hydroxide and quaternary ammonium salt are dissolved in the water. The quaternary ammonium hydroxide represented by formula (1) and the quaternary ammonium salt represented by formula (2) can be used as is, or can each be used as an aqueous solution. One of the quaternary ammonium hydroxide represented by formula (1) and the quaternary ammonium salt represented by formula (2) can be an aqueous solution, and the other one thereof can be mixed directly into the aqueous solution.

The silicon etching liquid of the present invention can also be produced in the following manner: a quaternary ammonium hydroxide represented by formula (2-1) is used in place of the quaternary ammonium salt represented by formula (2) to prepare an aqueous solution containing the quaternary ammonium hydroxide represented by formula (1) and the quaternary ammonium hydroxide represented by formula (2-1), and then an appropriate amount of acid represented by HX where X is the same as that in formula (2) is added to the aqueous solution:

$$R^5R^6R^7R^8N^+\cdot OH^- \quad (2\text{-}1)$$

where $R^5$, $R^6$, $R^7$, and $R^8$ are the same as those in formula (2).

The silicon etching liquid of the present invention can be used in a method for processing a silicon substrate. A method for processing a silicon substrate of another embodiment of the present invention is a method for processing a silicon substrate, the silicon substrate including at least one silicon material selected from the group consisting of a silicon wafer, a silicon single crystal film, a poly-silicon film, and an amorphous silicon film, the method including etching the at least one silicon material by using the above-described silicon etching liquid. The silicon single crystal film, poly-silicon film, and amorphous silicon film can be collectively referred to as a silicon film.

Accordingly, the silicon etching liquid described above can suitably be used in a method for producing a silicon device. A method for producing a silicon device of another embodiment of the present invention is a method for producing a silicon device, the silicon device including at least one silicon material selected from the group consisting of a silicon wafer, a silicon single crystal film, a poly-silicon film, and an amorphous silicon film, the method including etching the at least one silicon material by using the above-described silicon etching liquid.

An etching method in the etching step of each of the processing method for the silicon substrate and the production method for the silicon device is not particularly limited except that the silicon etching liquid described above is used, and can be carried out by a known method; for example, a method to be explained in the description of wet etching can be cited.

The processing method for the silicon substrate and the production method for the silicon device can each include a step other than the etching step, for example, a step of preparing an etching target.

In the present specification, the silicon wafer, silicon single crystal film, poly-silicon film, and amorphous silicon film are collectively referred to as a silicon material.

The substrate is a designation during the silicon device production process, and is also referred to as a silicon substrate in the specification of the present application.

A method for processing a substrate according to a first embodiment using the silicon etching liquid of the present invention includes, holding the substrate in a horizontal posture, and
supplying an isotropic silicon etching liquid of the present invention onto a principal surface of the substrate while rotating the substrate about a vertical rotation axis line passing through a central portion of the substrate.

A method for processing a substrate according to a second embodiment using the silicon etching liquid of the present invention includes, holding a plurality of substrates in an upright posture, and
immersing each of the plurality of substrates in the upright posture in the isotropic silicon etching liquid of the present invention stored in a processing tank.

In a preferred embodiment of the present invention, a silicon etching liquid can be used in a device production including a step of supplying the silicon etching liquid and smoothly etching at least one silicon material contained in a silicon substrate selected from the group consisting of a silicon single crystal film, a poly-silicon film, and an amorphous silicon film.

In consideration of the desired etching rate, the shape of the silicon after etching, the surface condition, the productivity, or the like, it is sufficient that the temperature of the silicon etching liquid during the etching according to each of the embodiments described above is determined appropriately within a range of 20° C. or higher and 95° C. or less, and a range of 50° C. or higher and 90° C. or less is preferred.

It is sufficient that wet etching of the silicon material only immerses an object to be etched in the silicon etching liquid, but it is also possible to employ an electrochemical etching method that applies a constant potential to the object to be etched such as an anodic oxidation method that applies a positive voltage after the immersion of the silicon material in the silicon etching liquid.

Examples of the silicon material to be etched in the present invention include silicon single crystal, poly-silicon, and amorphous silicon. The silicon material to be etched can even contain a film of a non-etching target, which is not intended to be etched, such as a silicon oxide film, a silicon nitride film, or a metal film (for example, an aluminum film). For example, an object in which a silicon oxide film, a silicon nitride film, and a metal film are layered and patterned on silicon single crystal; an object obtained by depositing and applying poly-silicon, resist, or the like on the above-mentioned object; a structure in which a metal portion such as aluminum is covered with a protective film and silicon is patterned; and the like can be cited.

EXAMPLES

Hereinafter, the present invention will be described more specifically based on examples, but the present invention is not limited to the examples below.

Example 1

A silicon etching liquid of the composition depicted in Table 1 was prepared, in which tetramethylammonium hydroxide (TMAH) was used as the quaternary ammonium hydroxide represented by formula (1), octyltrimethylammonium chloride was used as the quaternary ammonium salt represented by formula (2), and the remainder was water.

Evaluation of Surface Roughness of Silicon Single Crystal Substrate A silicon single crystal substrate (100 plane) having a size of 2 cm×2 cm was immersed in a silicon etching liquid heated to a liquid temperature (process temperature) described in Table 1 for 10 minutes, and then an etching rate ($R_{100}$) of silicon at that temperature was measured. A natural oxide film of the silicon single crystal substrate to be examined was removed by a chemical solution. The weights of the silicon single crystal substrate (100 plane) before and after the etching of the silicon single crystal substrate were measured, an etched amount of the silicon single crystal substrate was calculated using a difference between the weights before and after the etching processing, and then the etched amount was divided by the etching time to determine the etching rate. Likewise, a silicon single crystal substrate (111 plane) having a size of 2 cm×2 cm was immersed for 120 minutes, then an etching rate ($R_{111}$) of silicon at that temperature was measured, and an etching rate ratio ($R_{100}/R_{111}$) with the silicon single crystal substrate (100 plane) was determined.

The surface state of the silicon single crystal substrate (100 plane) after etching of approximately 1 μm was observed visually and observed with a field emission scanning electron microscope (FE-SEM), and the observation results were evaluated based on criteria described below. The results are depicted in Table 1.

<Evaluation Criteria for Surface Roughness of Silicon Single Crystal Substrate (100 Plane)>
(Visual Observation Result)

5: The substrate surface is not cloudy at all, and is specular.
3: The substrate surface is slightly cloudy, but is specular.
1: The substrate surface is completely cloudy, but is partly specular.
0: The substrate surface is completely cloudy, and is not specular at all due to severe surface roughness.

(FE-SEM Observation Result)

Three optional locations were selected and each location was observed at a twenty-thousand magnification, where an area of 50 μm square was observed to check the presence or absence of a hillock.

5: No hillock is observed on the entire surface of the evaluation substrate.
3: A small number of minute hillocks are observed on the evaluation substrate.
0: A large number of hillocks are observed on the evaluation substrate.

<Evaluation of Selection Ratio of Silicon Single Crystal and Silicon Oxide Film as well as Silicon Nitride Film>

A wafer with a silicon oxide film having a size of 2 cm×2 cm and a silicon nitride film having a size of 2 cm×2 cm deposited thereon was immersed in a silicon etching liquid heated to the liquid temperature (process temperature) described in Table 1 for 10 minutes, and then the etching rates of the silicon oxide film and the silicon nitride film at that temperature were measured. The film thicknesses before and after etching of the silicon oxide film and the film thicknesses before and after etching of the silicon nitride film were measured with a spectroscopic ellipsometer, the etching amounts of each of the silicon oxide film and the silicon nitride film were calculated using a difference in the film thicknesses before and after the etching processing, and determined each etching rate by dividing the etched amount by the etching time. Subsequently, by using the etching rate ($R_{100}$) of the silicon single crystal substrate (100 plane) measured by the above-described method, etching rate ratios ($R_{100}$/silicon oxide film) and ($R_{100}$/silicon nitride film) with the silicon single crystal substrate (100 plane) were calculated, and the calculated ratios were evaluated based on criteria described below. The results are depicted in Table 1.
<Evaluation Criteria for Selection Ratio of Silicon Single Crystal and Silicon Oxide Film as well as Silicon Nitride Film>
Evaluation Criteria for a Selection Ratio of Silicon Single Crystal and a Silicon Oxide Film (Si (100 Plane)/$SiO_2$):
  A: 1000 or greater; B: 700 or greater and less than 1000;
  C: 500 or greater and less than 700; D: less than 500
Evaluation Criteria for a Selection Ratio of Silicon Single Crystal and a Silicon Nitride Film (Si (100 Plane)/SiN):
  A: 1000 or greater; B: 700 or greater and less than 1000;
  C: 500 or greater and less than 700; D: less than 500
In the above evaluations, the etching selection ratios greater than or equal to B were considered to exhibit favorable selectivity. Here, a selection ratio of potassium hydroxide (KOH) as inorganic alkali (Si (100 plane)/$SiO_2$) is approximately 250, which is classified as D based on the above criteria.

Examples 2 to 20

Each of the properties was evaluated in a similar manner to that in Example 1 except that silicon etching liquids of the compositions depicted in Table 1 were used, where the types and quantities of the quaternary ammonium hydroxide represented by formula (1) and the quaternary ammonium salt represented by formula (2) were varied, and etching was performed at the temperatures depicted in Table 1. The evaluation results are depicted in Table 1.

Comparative Examples 1 to 5

Each of the properties was evaluated in a similar manner to that in Example 1 except that silicon etching liquids of the compositions depicted in Table 1 containing no quaternary ammonium salt represented by formula (2) were used as the silicon etching liquids. The results are depicted in Table 1.

TABLE 1

| | Silicon Etching Liquid | | | | |
|---|---|---|---|---|---|
| | Quaternary ammonium hydroxide (compound represented by formula (1)) | Content (mol/L) | Quaternary ammonium salt (compound represented by formula (2)) | Content (wt. %) | Process Temperature (° C.) |
| Example 1 | TMAH | 0.26 | Octyltrimethyl ammonium chloride | 10 | 70° C. |
| Example 2 | TMAH | 0.26 | Decyltrimethyl ammonium chloride | 5 | 70° C. |
| Example 3 | TMAH | 0.26 | Decyltrimethyl ammonium bromide | 10 | 70° C. |
| Example 4 | TMAH | 0.26 | Dodecyltrimethyl ammonium chloride | 3 | 70° C. |
| Example 5 | TMAH | 0.26 | Hexyltrimethyl ammonium bromide | 20 | 70° C. |
| Example 6 | TMAH | 0.26 | Octyltrimethyl ammonium bromide | 15 | 70° C. |
| Example 7 | TMAH | 0.26 | Decyltrimethyl ammonium bromide | 3 | 70° C. |
| Example 8 | TMAH | 0.26 | Decyltrimethyl ammonium bromide | 15 | 70° C. |
| Example 9 | TMAH | 0.26 | Dodecyltrimethyl ammonium bromide | 5 | 70° C. |
| Example 10 | TMAH | 0.26 | Tetradecyltrimethyl ammonium bromide | 3 | 70° C. |
| Example 11 | TMAH | 0.26 | Hexadecyltrimethyl ammonium bromide | 0.5 | 70° C. |
| Example 12 | TMAH | 0.26 | Hexadecyltrimethyl ammonium bromide | 1.5 | 70° C. |
| Example 13 | TMAH | 0.26 | Tetraethyl ammonium chloride | 35 | 70° C. |
| Example 14 | TMAH | 0.26 | Tetrapropyl ammonium chloride | 35 | 70° C. |
| Example 15 | TMAH | 0.26 | Tetrabutyl ammonium chloride | 10 | 70° C. |
| Example 16 | TMAH | 0.26 | Dodecyltrimethyl ammonium bromide | 0.5 | 70° C. |
| Example 17 | TMAH | 0.26 | Octyltrimethyl ammonium chloride | 10 | 60° C. |
| Example 18 | TMAH | 0.26 | Decyltrimethyl ammonium chloride | 5 | 60° C. |
| Example 19 | TEAH | 0.26 | Octyltrimethyl ammonium chloride | 10 | 60° C. |
| Example 20 | TEAH | 0.26 | Decyltrimethyl ammonium bromide | 5 | 60° C. |

TABLE 1-continued

| | | | | | |
|---|---|---|---|---|---|
| Comparative Example 1 | TMAH | 0.26 | — | — | 70° C. |
| Comparative Example 2 | TMAH | 0.26 | — | — | 60° C. |
| Comparative Example 3 | TEAH | 0.26 | — | — | 70° C. |
| Comparative Example 4 | TEAH | 0.26 | — | — | 60° C. |
| Comparative Example 5 | KOH | 3.08 | — | — | 60° C. |

| | Surface State Evaluation * | | Si(100/111) | Selection Ratio Evaluation (A-D) | |
|---|---|---|---|---|---|
| | Visual evaluation | FE-SEM Evaluation | Etching Rate Ratio (R110/R111) | Si/SiO$_2$ | Si/SiN |
| Example 1 | 5 | 5 | 2.8 | A | A |
| Example 2 | 5 | 5 | 2.4 | A | A |
| Example 3 | 5 | 5 | 2.2 | A | A |
| Example 4 | 5 | 5 | 2.5 | A | A |
| Example 5 | 5 | 3 | 3.1 | A | A |
| Example 6 | 5 | 5 | 2.8 | A | A |
| Example 7 | 5 | 5 | 2.3 | A | A |
| Example 8 | 5 | 5 | 2.3 | A | A |
| Example 9 | 5 | 5 | 2.4 | A | A |
| Example 10 | 5 | 5 | 2.5 | A | A |
| Example 11 | 3 | 3 | 3.4 | A | A |
| Example 12 | 5 | 5 | 2.6 | A | A |
| Example 13 | 5 | 3 | 3.0 | A | A |
| Example 14 | 5 | 5 | 2.3 | A | A |
| Example 15 | 5 | 5 | 2.2 | A | A |
| Example 16 | 3 | 3 | 3.5 | A | A |
| Example 17 | 5 | 5 | 2.8 | A | A |
| Example 18 | 5 | 5 | 2.2 | A | A |
| Example 19 | 5 | 5 | 2.6 | A | A |
| Example 20 | 5 | 5 | 2.2 | A | A |
| Comparative Example 1 | 1 | 0 | 4.5 | A | A |
| Comparative Example 2 | 1 | 0 | 3.9 | A | A |
| Comparative Example 3 | 1 | 0 | 4.5 | A | A |
| Comparative Example 4 | 1 | 0 | 4.5 | A | A |
| Comparative Example 5 | 1 | 0 | 7.0 | D | D |

* Visual evaluation (5, 3, 1, 0), FE-SEM Evaluation (5, 3, 0)

The invention claimed is:

1. A silicon etching liquid consisting essentially of:
water;
a quaternary ammonium hydroxide represented by formula (1):

$$R^1R^2R^3R^4N^+ \cdot OH^- \quad (1)$$

where
R$^1$, R$^2$, R$^3$, and R$^4$ each represent an alkyl group, an aryl group, or a benzyl group optionally having a substituent, and are optionally the same group or different groups from each other; and
a quaternary ammonium salt represented by formula (2):

$$R^5R^6R^7R^8N^+ \cdot X^- \quad (2)$$

where
with the proviso that a total number of carbon atoms per molecule of the quaternary ammonium salt represented by formula (2) is 4 or more and 12 or less, R$^5$, R$^6$, R$^7$, and R$^8$ each represent an alkyl group optionally having a substituent, and are optionally the same group or different groups from each other, and
X represents a chlorine atom, or a bromine atom; wherein
a concentration of the quaternary ammonium salt represented by formula (2) is more than 1 mass % and not more than 50 mass %.

2. The silicon etching liquid according to claim 1, wherein the total number of carbon atoms per molecule of the quaternary ammonium salt represented by formula (2) 8 or more and 12 or less.

3. A method for processing a silicon substrate, the silicon substrate containing at least one silicon material selected from the group consisting of a silicon wafer, a silicon single crystal film, a poly-silicon film, and an amorphous silicon film, the method comprising:
etching the at least one silicon material by using the silicon etching liquid according to claim 1.

4. A method for producing a silicon device, the silicon device containing at least one silicon material selected from the group consisting of a silicon wafer, a silicon single crystal film, a poly-silicon film, and an amorphous silicon film, the method comprising:
etching the at least one silicon material by using the silicon etching liquid according to claim 1.

5. A method for processing a silicon substrate, the silicon substrate containing at least one silicon material selected from the group consisting of a silicon wafer, a silicon single crystal film, a poly-silicon film, and an amorphous silicon film, the method comprising:
   etching the at least one silicon material by using the silicon etching liquid according to claim 2.

6. A method for producing a silicon device, the silicon device containing at least one silicon material selected from the group consisting of a silicon wafer, a silicon single crystal film, a poly-silicon film, and an amorphous silicon film, the method comprising:
   etching the at least one silicon material by using the silicon etching liquid according to claim 2.

* * * * *